(12) United States Patent
Giardina et al.

(10) Patent No.: US 6,931,080 B2
(45) Date of Patent: Aug. 16, 2005

(54) MULTIPLE STAGE AND/OR NESTED PREDISTORTION SYSTEM AND METHOD

(75) Inventors: Charles Robert Giardina, Mahwah, NJ (US); Jaehyeong Kim, Pine Brook, NJ (US); Haobo Lai, Keamy, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 761 days.

(21) Appl. No.: 09/928,628

(22) Filed: Aug. 13, 2001

(65) Prior Publication Data

US 2003/0031270 A1 Feb. 13, 2003

(51) Int. Cl.⁷ .................................. H04L 25/49
(52) U.S. Cl. ..................................... 375/296
(58) Field of Search ......................... 375/296

(56) References Cited

U.S. PATENT DOCUMENTS

| | | | |
|---|---|---|---|
| 5,193,224 A | | 3/1993 | McNicol et al. |
| 5,386,198 A | * | 1/1995 | Ripstrand et al. ............ 330/52 |
| 5,483,681 A | | 1/1996 | Bergsten et al. |
| 5,789,976 A | * | 8/1998 | Ghannouchi et al. ......... 330/52 |
| 5,831,478 A | * | 11/1998 | Long ........................... 330/52 |
| 6,169,450 B1 | * | 1/2001 | Gentzler ....................... 330/52 |
| 6,211,733 B1 | * | 4/2001 | Gentzler ....................... 330/149 |
| 6,275,105 B1 | * | 8/2001 | Ghannouchi et al. ........ 330/151 |
| 2002/0101937 A1 | * | 8/2002 | Antonio et al. .............. 375/297 |
| 2002/0191710 A1 | * | 12/2002 | Jeckeln et al. .............. 375/296 |
| 2004/0037364 A1 | * | 2/2004 | Gagey et al. ................ 375/261 |

FOREIGN PATENT DOCUMENTS

WO    WO 00 7750 A    11/2000    ............. H03F/1/32

* cited by examiner

Primary Examiner—Mohammed Ghayour
Assistant Examiner—Anika Talapatra
(74) Attorney, Agent, or Firm—Julio A. Garceran

(57) ABSTRACT

A predistortion system and method uses an inner predistortion function to adjust a signal being input into a distortion generating circuit and at least one outer predistortion function to adjust the signal being input into the inner predistortion function. Thus, the inner predistortion function can reduce the distortion from the distortion generating circuitry, and any remaining distortion can be reduced by the outer predistortion function.

4 Claims, 2 Drawing Sheets

ND_MULTIPLE STAGE AND/OR NESTED
PREDISTORTION SYSTEM AND METHOD

BACKGROUND OF THE INVENTION

1. Field of the Invention

This invention relates to communications, and, more particularly, to a system and method for reducing distortion using predistortion.

2. Description of Related Art

An ideal power amplifier amplifies an input signal with no waveshape alteration. The ideal power amplifier is therefore characterized as having a transfer function (input signal vs. output signal) which is linear with no transfer function discontinuities. In practice, however, a power amplifier has a transfer function with nonlinear and "linear" regions. Whether the power amplifier is operating in a linear or nonlinear region depends in part on the amplitude of the input signal. For the power amplifier to achieve as near to linear operation as possible, the power amplifier is designed to operate within its linear region given the range of possible input signal amplitudes. If the input signal has an amplitude which causes the power amplifier to operate outside the linear region, the power amplifier introduces nonlinear components or distortion to the signal. When the input signal possesses peak amplitudes which cause the amplifier to compress, to saturate (no appreciable increase in output amplitude with an increase in input amplitude) or to shut-off (no appreciable decrease in output amplitude with a decrease in input amplitude), the output signal is clipped or distorted in a nonlinear fashion. Generally, an amplifier is characterized as having a clipping threshold, and input signals having amplitudes beyond the clipping threshold are clipped at the amplifier output. In addition to distorting the signal, the clipping or nonlinear distortion of the input signal, generates spectral regrowth or adjacent channel power (ACP) that can interfere with an adjacent frequency.

In wireless communications systems, high power amplification of signals for transmission are commonly encountered with very large peak to average power ratios (PAR). For example, in a time division multiple access (TDMA) system, such as Global System for Mobile Communications (GSM) or North American TDMA, when multiple carrier signals are combined for amplification with a power amplifier, the resulting PAR is about 9–10 dB for a large number of carriers. In a code division multiple access (CDMA) system, a single loaded 1.25 Mhz wide carrier can typically have a PAR of 11.3 dB. For orthogonal frequency division multiplexing (OFDM), multicarrier signals can have a PAR of up to 20 dB. These signals have to be amplified fairly linearly to avoid generating ACP.

Unfortunately, efficiency of the base station amplifier is inversely related to its linearity. To achieve a high degree of linearity, the amplifiers are biased to operate in the class A or "slight" class AB (meaning class AB operation that is closer to class A than to class B). Maximum AC to DC efficiency achievable for class A operation is 50%, whereas that of a class AB amplifier is between 50 and 78.5% (the latter representing the maximum efficiency of a class B amplifier). The closer the particular class AB operation is to class A, the lower the maximum efficiency.

Typically, strict linearity requirements in modern wireless communication systems dictate the use of the relatively inefficient class A or slight class AB modes. As a result, significant DC power is dissipated by the amplifiers, thereby generating heat which must be controlled to avoid degrading amplifier performance and reliability. Hence, the use of elaborate heat sinks and fans become a necessary by-product of the high linearity system. Naturally, these measures add to the cost, size and weight of the base station equipment. As the number of wireless communications users continues to grow, so do the number of base stations and the need to keep them small, light and inexpensive. Thus, a great deal of research has focused on the quest to improve amplifier efficiency in these and other systems.

Various linearization methods are used to enable the use of more cost-effective and more power efficient amplifiers while maintaining an acceptable level of linearity. Feed-forward correction is routinely deployed in modern amplifiers to improve the linearity of the main amplifier with various input patterns. The essence of the feed-forward correction is to isolate the distortion generated by the main amplifier on a feed forward path. The distortion is provided to a correction amplifier on the feed forward path which amplifies the distortion. The distortion on the feed forward path is combined with the distortion on the main signal path to cancel the distortion on the main signal path. Predistortion techniques distort the input signal prior to amplification by taking into account the transfer function characteristics for the amplifier. As such, the desired amplified signal is achieved from the predistorted input signal by intentionally distorting the signal before the amplifier, so the non-linearity of the amplifier can be compensated.

FIG. 1 shows a general functional block diagram of an adaptive power amplifier predistortion system 10. The baseband digital input signal $u_n$ on a main signal path 12 is input into the predistortion function 14 (A(.)) to produce a predistorted output $x_n$ where n is the time index. After digital to analog conversion by digital to analog (D/A) converter 16, the resulting analog signal is frequency up-converted in an up-conversion process 18 to radio frequency (RF). The analog RF signals are amplified by power amplifier 20 for transmission over the air using antenna 22. A replica of the amplified analog RF signals is coupled off the main signal path 12 onto a predistortion feedback path 24. The amplified analog RF signals on the predistortion feedback path 24 are down-converted by a down-conversion process 26.

The down-converted analog signals on the predistortion feedback path 24 are provided to an analog to digital (A/D) converter 28 for conversion into the digital domain. The resulting digital signal, which represents the output of the amplifier 20, is provided to an amplifier characteristics estimation block 30 along with the digital baseband signal $x_n$ which represents the corresponding input to the amplifier 20. Given the digital signals $x_n$ prior to amplification and the digital signals $y_n$ resulting from the amplification of the analog and frequency converted versions of the digital signals $x_n$, the amplifier characteristics estimation block 30 can determine the characteristics or model function of the amplifier 20. Once the model or characteristics function of the amplifier 20 is estimated, a predistortion calculation process 34 determines the predistortion function as the inverse of the amplifier characteristics function, and the predistortion function 14 (A(.)) applied to the input signal $u_n$ is updated based on the predistortion calculation process 34.

FIG. 2 is a general block diagram for an adaptive digital predistortion system. An amplifier 40 is characterized by a baseband function B(.) with complex inputs and complex outputs. There are many methods for adaptive digital predistortion which are generally divided into two steps as mentioned above. First, an amplifier characteristics estimation block 42 determines the characteristics or model function B(.) of the amplifier 20, where proper modeling and parameter estimation based the model function is needed. Using input samples $x_n$ and corresponding amplified output samples $y_n$, the amplifier characterization estimation block 34 adapts the model for the amplifier 40 over time. Second, the predistortion calculation process 44 determines the predistortion function as the inverse of the model function B(.) and updates the predistortion function 46 applied to the digital input signal $u_n$.

In general, the output $y_n$ of the amplifier 40 is a function of input samples $\{x_n, x_{n-1}, x_{n-2} \ldots\}$ and previous output samples $\{y_{n-1}, y_{n-2}, \ldots\}$. Let b be the vector of coefficients for B(.), then the estimation of the amplifier characteristics is obtaining b from the following equation:

$$b = \arg\min E\left[|B(x_n, x_{n-1}, x_{n-2}, \ldots y_{n-1}, y_{n-2}, \ldots) - y_n|^2\right],$$

where E[.] means expected value and arg min f(.) means the arguments of the function f(.) that makes f(.) minimum. In other words, b is the vector of coefficients that minimizes the power of the estimation error, $B(.) - y_n$. The predistortion function A(.) is produced by determining the inverse function of B(.).

Due to the potential for high peak powers in wireless communications signals, CDMA, TDMA and frequency division multiple access (FDMA) base stations typically use radio frequency (RF) amplifiers operating in class AB mode and biased with a high current to be able to handle those peak powers. The efficiency of these amplifiers is typically less than 10%. This low efficiency leads to higher power consumption, lower overall reliability and higher operating temperatures. Accordingly, there is a need for a more efficient power amplifier architecture which can amplify signals having potentially high peak powers in a linear fashion.

SUMMARY OF THE INVENTION

The present invention is a multiple stage and/or nested predistortion system and method using an inner predistortion function to adjust a signal being input into a distortion generating circuit and at least one outer predistortion function to adjust the signal being input into the inner predistortion function. Thus, the inner predistortion function can reduce the distortion from the distortion generating circuitry, and any remaining distortion can be reduced by the outer predistortion function. For example, in an adaptive predistortion system where the distortion generating circuit is an amplifier, an inner predistortion loop comprises an inner predistortion function which distorts the signal on the main signal path prior to the amplifier. The inner predistortion function can be produced using an output of the inner predistortion function and an output of the amplifier. An outer predistortion loop comprises an outer predistortion function which distorts the input signal prior to the inner predistortion function. The outer predistortion function can be determined using an output to the outer predistortion function and the output to the inner predistortion loop. As such, the signal on the signal path is predistorted in multiple stages prior to the amplifier to compensate for the distortion generated by the amplification of the signal, and the resulting amplified signal is produced with reduced distortion.

BRIEF DESCRIPTION OF THE DRAWINGS

Other aspects and advantages of the present invention may become apparent upon reading the following detailed description and upon reference to the drawings in which.

DETAILED DESCRIPTION

Figure 1:
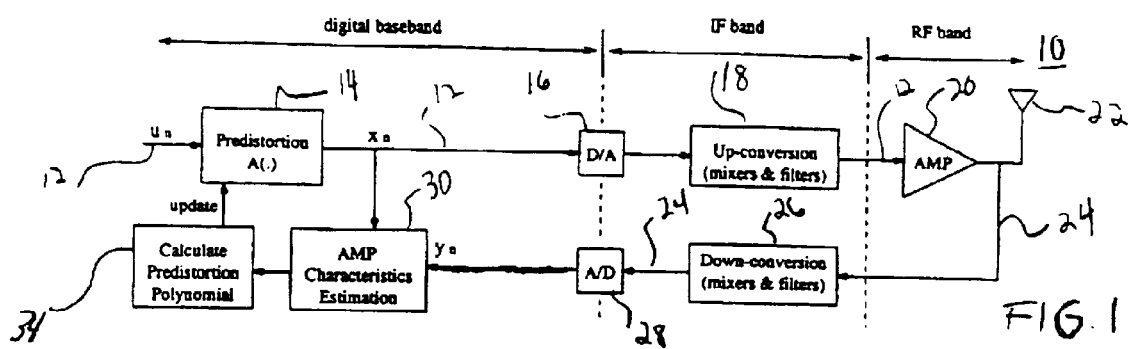
FIG. 1 shows a general functional block diagram of a typical adaptive power amplifier predistortion system.
Figure 2:
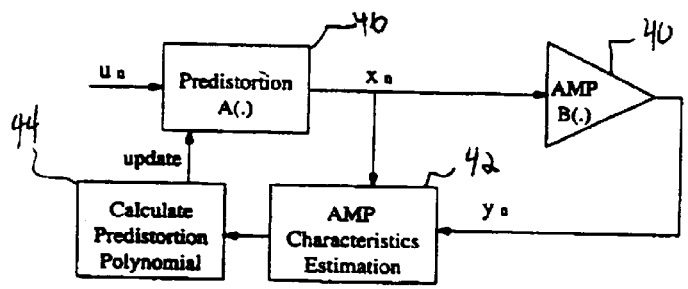
FIG. 2 shows a general model of an adaptive power amplifier predistortion system.
Figure 3:
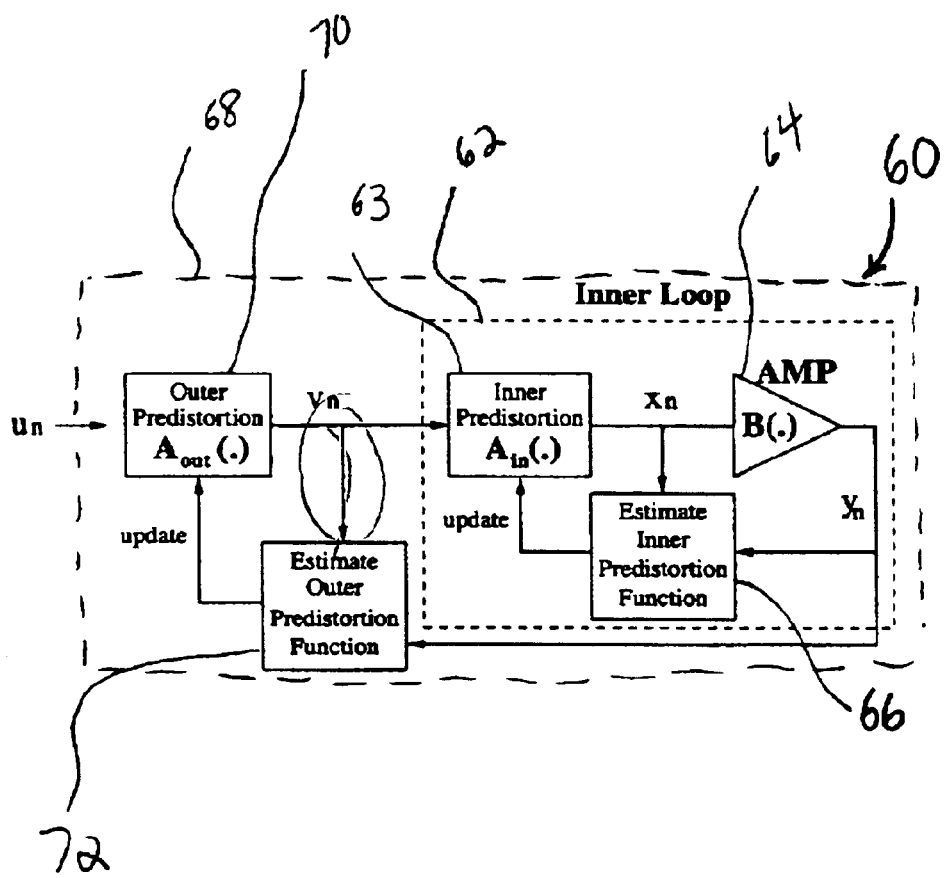
FIG. 3 shows a general functional block diagram for nested predistortion circuitry according to principles of the present invention.

An illustrative embodiment of an adaptive predistortion system and method according to principles of the present invention is described below which uses nested predistortion loops. FIG. 3 shows a nested predistortion system 60 using an inner predistortion loop 62 including an inner predistortion function ($A_{in}(.)$) implemented in block 63 to distort a signal $v_n$ and produce a predistorted signal $x_n$ to a distortion generating circuit (B(.)), such as an amplifier 64. Within the inner loop 62 of this embodiment, the output $y_n$ of the amplifier 64 and the output $x_n$ of the inner predistortion function block 63 is used by an inner predistortion estimation block 66 to produce the inner predistortion function $A_{in}(.)$, for example by estimating, determining, calibrating, and/or updating the inner predistortion function ($A_{in}(.)$).

The nested predistortion circuitry 60 includes at least one outer predistortion function loop 68 including at least one outer predistortion function $A_{out}(.)$. In the embodiment shown in FIG. 3, the outer predistortion loop 68 comprises an outer predistortion function implemented in block 70 to distort the input signal $u_n$ prior to the inner predistortion function 63 to produce a predistorted signal $v_n$ which is input into the inner predistortion loop 62. Within the outer predistortion loop 68 of this embodiment, the output $y_n$ of the inner predistortion loop 62 and the output $v_n$ of the outer predistortion function 70 is used by the outer predistortion estimation block 72 to produce the outer predistortion function $A_{out}(.)$, for example by estimating, determining, calibrating, and/or updating the outer predistortion function ($A_{out}(.)$). Thus, the inner predistortion loop 62 can reduce the non-linearity of the amplifier 64, and any remaining non-linearity can be reduced by the outer predistortion loop 68.

Depending on the embodiment, the inner and/or outer predistortion functions can be produced in different ways. For example, the inner predistortion function 63 can be produced by the inner predistortion determination block 66 as described above by first determining the characteristics or model function B(.) of the amplifier 64. Using input samples $x_n$ and corresponding amplified output samples $y_n$, the amplifier characterization function can be adapted over time. Next, the predistortion function can be produced as the inverse of the model function B(.), and the predistortion function 63 applied to the signal $v_n$ is updated. As mentioned above, the output $y_n$ of the amplifier 64 is a function of input samples $\{x_n, x_{n-1}, x_{n-2} \ldots\}$ and previous output samples $\{y_{n-1}, y_{n-2}, \ldots\}$. Let b be the vector of coefficients for B(.), then the estimation of the amplifier characteristics is obtaining b from the following equation:

$$b = \arg\min E\left[|B(x_n, x_{n-1}, x_{n-2}, \ldots y_{n-1}, y_{n-2}, \ldots) - y_n|^2\right],$$

where E[.] means expected value and arg min f(.) means the arguments of the function f(.) that makes f(.) minimum. In other words, b is the vector of coefficients that minimizes the power of the estimation error, $B(.) - y_n$. The inner predistortion function A(.) is obtained by determining the inverse function of B(.).

The outer predistortion function 70 can be produced by the outer predistortion determination block 72 as described above by first determining the characteristics or model function (C(.)) of the inner predistortion loop 62. Using input samples $v_n$ and corresponding amplified output samples $y_n$, the characterization function for the inner predistortion loop 62 can be adapted over time. Next, the predistortion function can be produced as the inverse of the model function for the inner predistortion loop 62, and the predistortion function 70 applied to the signal $v_n$ is updated. The output $y_n$ of the inner predistortion loop 62 is a function of input samples $\{v_n, v_{n-1}, v_{n-2} \ldots\}$ and previous output samples $\{y_{n-1}, y_{n-2}, \ldots\}$. Let c be the vector of coefficients for the characterization function of the inner predistortion loop 62, then the estimation of the inner predistortion loop characteristics is obtaining c from the following equation:

$$c = \arg\min E\left[|C(v_n, v_{n-1}, v_{n-2}, \ldots y_{n-1}, y_{n-2}, \ldots) - y_n|^2\right],$$

where E[.] means expected value and arg min f(.) means the arguments of the function f(.) that makes f(.) minimum. In other words, c is the vector of coefficients that minimizes the power of the estimation error, $C(.)-y_n$. The outer predistortion function $A_{out}(.)$ is obtained by determining the inverse function of C(.).

In alternative embodiments, additional outer predistortion loops encompassing the inner and outer predistortion loops 62 and 68 can treat the encompassed predistortion loops as an amplifier for the purposes of characterizing the encompassed predistortion loops and/or producing the additional outer predistortion functions as would be understood by one of skill in the art with the benefit of this disclosure.

In alternative embodiments, the inner and/or outer predistortion functions implemented in blocks 63 and/or 70 are determined by directly estimating the predistortion function using the inputs and outputs to the amplifier (or encompassed predistortion loop(s)) without calculating the amplifier (or encompassed predistortion loop(s)) characteristics function and its inverse. For example, a sequence of input signals $\{v_n\}$ are provided to the inner predistortion function implemented in block 63 ($A_{in}(.)$) to produce the predistorted signal or the output of the predistortion function $x_n = A0_{in}(v_n) + A1_{in}(v_{n-1}) + A2_{in}(v_{n-2})\ldots$. The predistorted sequence of signals $\{x_n\}$ is provided to the amplifier 64 for amplification. The amplified signal is produced as a sequence $\{y_n\}$ of signals which has the same waveshape as the input signal $\{v_n\}$ since $A_{in}(.)$ and B(.) are inverse functions. Since $A_{in}(.)$ and B(.) are inverse functions, sequences $\{y_n\}$ and $\{x_n\}$ can be considered inputs and outputs of the predistortion function $A_{in}(.)$ respectively. Rather than determining a model B(.) for the amplifier 64 and then calculating an inverse function $A_{in}(.)$ from the amplifier model B(.), the inner predistortion function $A_{in}(.)$ can be directly estimated at the predistortion function estimation block 66 using the actual output $x_n$ of the inner predistortion circuitry or block 63 and an expected output of the predistortion block 63 which can be determined using an output $y_n$ of the amplifier 64. In this embodiment, the predistortion function $A_{in}(.)$ can be estimated as described in the following equation. Let a be the vector of coefficients for $A_{in}(.)$, then the estimation of the predistortion function is obtaining a from the following equation:

$$a = \arg\min E[|A_{in}(y_n, y_{n-1}, y_{n-2}, \ldots, x_{n-1}, x_{n-2}, \ldots) - x_n|^2].$$

To directly determine the outer predistortion function $A_{out}(.)$ implemented in block 70, the inner loop 62 can be treated as an amplifier with an amplifier characteristics function C(.). For example, a sequence of input signals $\{u_n\}$ are provided to the outer predistortion function implemented in block 70 ($A_{out}(.)$) to produce the predistorted signal or the output of the predistortion function $v_n = A0_{out}(u_n) + A1_{out}(u_{n-1}) + A2_{out}(u_{n-2})\ldots$. The predistorted sequence of signals $\{v_n\}$ is provided to the inner loop 62 for amplification. The amplified signal is produced as a sequence $\{y_n\}$ of signals which has the same waveshape as the input signal $\{u_n\}$ since $A_{out}(.)$ and C(.) are inverse functions. Since $A_{out}(.)$ and C(.) are inverse functions, sequences $\{y_n\}$ and $\{u_n\}$ are inputs and outputs of the predistortion function $A_{out}(.)$ respectively. Rather than determining a model C(.) for the inner loop 62 and then calculating an inverse function from the model, the outer predistortion function $A_{out}(.)$ can be directly estimated at the predistortion function estimation block 72 using the actual output $v_n$ of the outer predistortion circuitry or block 70 and an expected output of the predistortion block 70 which can be determined using an output $y_n$ of the inner loop 62. In this embodiment, the outer predistortion function $A_{out}(.)$ can be estimated as described in the following equation. Let a be the vector of coefficients for $A_{out}(.)$, then the estimation of the predistortion function is obtaining a from the following equation:

$$a = \arg\min E[|A_{out}(y_n, y_{n-1}, y_{n-2}, \ldots, u_{n-1}, u_{n-2}, \ldots) - u_n|^2].$$

Power amplifiers have memory characteristics depending on signal frequency where the output of the amplifier is not only the function of the current input but also the function of the past inputs and outputs. Thus, in this embodiment, the predistortion model is produced using a current and at least one past sample. As such, the predistortion circuitry 60 includes circuitry to retain successive time spaced samples of the different signals, and such circuitry can include delays, shift registers, buffers, arrays, or other forms of storage or ways of retaining successive time samples. In alternative embodiments, the predistortion function can be simply based on a current input signal, thereby providing memoryless predistortion.

As would be understood by one of skill in the art, there are many degrees of freedom for choosing the model of the predistortion function, for example using different forms of polynomial estimation. The estimation and implementation can be made easier by choosing a simple predistortion model. However, if the predistortion model is made too general, the estimation and implementation could be difficult. Depending on the predistortion model or function(s), the predistortion circuitry 60 can be implemented in different ways. For example, the predistortion function estimation block(s) 66 and/or 72 and/or the predistortion function block(s) 63 and/or 70 can be implemented with processing circuitry which produces the predistortion function and applies the predistortion function to the input signal by producing phase and/or amplitude adjustment signals to amplitude and/or phase adjusters to distort the input signal. Alternatively, the predistortion function estimation block(s) 66 and/or 72 can be implemented with processing circuitry which produces the predistortion function and updates the predistortion function block(s) 63 and/or 70 which apply the predistortion function to the input signal. The predistortion function block(s) 63 and/or 70 can be implemented using look-up tables, such as field programmable gate array look-up tables, which can be updated by the processing circuitry, which produce phase and/or amplitude adjustment signals to amplitude and/or phase adjusters to distort the input signal based on the signal samples. Combinations of different components, such as mixers, summers and look-up tables, can be used to apply the predistortion function on the signal to be predistorted as would be understood by one of skill in the art.

In addition to the embodiment described above, alternative configurations of the predistortion system according to the principles of the present invention are possible which omit and/or add components and/or use variations or portions of the described system. For example, greater than two predistortion functions, stages and/or loops can be used to predistort a signal prior to a distortion generating circuit. Additionally, the predistortion circuitry or portions thereof can be implemented at baseband, intermediate frequency (IF) and/or radio frequency (RF) in the analog and/or digital domain or in other amplifier or electrical circuit arrangements.

The embodiment of the predistortion system has been described in the context of an adaptive predistortion architecture to reduce the distortion generated at the output of an amplifier, but the predistortion system can be used in a multiple stage predistortion system using single or multiple fixed predistortion functions to predistort a signal to reduce the distortion generated by any distortion generating circuitry which acts on the signal. Depending on the application, the predistortion circuitry can be positioned in or in addition to a feed forward or other linearization or efficiency-improving techniques. Furthermore, the inner and outer predistortion functions can use different models and different predistortion function determination and implementation schemes. Moreover, as such, an outer predistortion scheme can be implemented around an existing predistortion scheme to provide improved performance. The predistortion system has been described as using a particular configuration of distinct functional blocks, but it should be understood that the predistortion system and portions thereof can be implemented in application specific integrated circuits, software-driven processing circuitry, firmware, hardware, discrete components or combination(s) or portion(s) thereof as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of predistorting an input signal, said method comprising the steps of:

using at least one outer predistortion function to adjust said input signal to produce an outer predistorted signal to be applied to an inner predistortion function;

using said inner predistortion function to adjust said outer predistorted signal to produce an inner predistorted signal to be applied to a distortion generating circuit;

producing said outer predistortion function using said outer predistorted signal and an output of said distortion generating circuit; and producing said inner predistortion function using said inner predistorted signal and said output of said distortion generating circuit.

2. The method of claim 1 further comprising:

using an amplifier as said distortion generating circuitry.

3. A predistortion system comprising:

a distortion generating circuit; and predistortion circuitry adapted to use at least one outer predistortion function to adjust an input signal to produce an outer predistorted signal to be applied to an inner predistortion function, and to adjust said outer predistorted signal using said inner predistortion function to produce an inner predistorted signal to be applied to said distortion generating circuit, wherein said predistortion circuitry is configured to produce said outer predistortion function using said outer predistorted signal and an output of said distortion generating circuit, and said predistortion circuitry is configured to produce said inner predistortion function using said inner predistorted signal and said output of said distortion generating circuit.

4. The system of claim 3 wherein said distortion generating circuit is an amplifier.

* * * * *